(12) United States Patent
Morris et al.

(10) Patent No.: US 7,098,952 B2
(45) Date of Patent: Aug. 29, 2006

(54) IMAGER HAVING MULTIPLE STORAGE LOCATIONS FOR EACH PIXEL SENSOR

(75) Inventors: Tonia G. Morris, Chandler, AZ (US);
Kevin M. Connolly, Chandler, AZ (US); Larry A. Booth, Jr., Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 297 days.

(21) Appl. No.: 09/106,994

(22) Filed: Jun. 29, 1998

(65) Prior Publication Data

US 2003/0067547 A1    Apr. 10, 2003

Related U.S. Application Data

(63) Continuation-in-part of application No. 09/061,303, filed on Apr. 16, 1998, now Pat. No. 6,078,037.

(51) Int. Cl.
*H04N 3/14*    (2006.01)
*H04N 5/335*    (2006.01)

(52) U.S. Cl. ........................ 348/308; 348/270

(58) Field of Classification Search ................ 348/360, 348/361, 266, 268, 270, 271, 308, 281, 269, 348/272; 250/208.1
See application file for complete search history.

(56) References Cited

U.S. PATENT DOCUMENTS

| | | | | |
|---|---|---|---|---|
| 3,995,107 A | * | 11/1976 | Woywood | 348/316 |
| 4,845,540 A | * | 7/1989 | Baker et al. | 348/302 |
| 4,989,075 A | * | 1/1991 | Ito | 348/280 |
| 5,461,425 A | * | 10/1995 | Fowler et al. | 250/208.1 |
| 5,461,491 A | * | 10/1995 | Degi | 250/208.1 |
| 5,754,229 A | * | 5/1998 | Elabd | 348/270 |
| 5,872,596 A | * | 2/1999 | Yanai et al. | 348/296 |
| 5,909,026 A | * | 6/1999 | Zhou et al. | 250/208.1 |
| 5,982,425 A | * | 11/1999 | Allen et al. | 348/281 |
| 6,344,877 B1 | * | 2/2002 | Gowda et al. | 348/308 |
| 6,369,737 B1 | * | 4/2002 | Yang et al. | 341/155 |
| 6,606,120 B1 | * | 8/2003 | Merrill et al. | 348/308 |

FOREIGN PATENT DOCUMENTS

| | | |
|---|---|---|
| EP | 0 603 877 A2 | 6/1994 |
| EP | 0 774 870 A2 | 5/1997 |
| WO | WO 95/22180 | 8/1995 |
| WO | WO 96/15626 | 5/1996 |
| WO | WO 97/08897 | 3/1997 |
| WO | WO 98/19455 | 5/1998 |
| WO | WO-98/19455 A1 * | 5/1998 |

* cited by examiner

*Primary Examiner*—Tuan Ho
*Assistant Examiner*—Jason Whipkey
(74) *Attorney, Agent, or Firm*—Trop, Pruner & Hu, P.C.

(57) ABSTRACT

An imager includes an array of pixel sensors. Each pixel sensor indicates at least two different primary color components of an image. For each pixel sensor, at least two storage locations are located in the array and store the indications from the pixel sensor.

10 Claims, 6 Drawing Sheets

IMAGER HAVING MULTIPLE STORAGE LOCATIONS FOR EACH PIXEL SENSOR

RELATED APPLICATIONS

This is a continuation-in-part of U.S. patent application Ser. No. 09/061,303, entitled, "Active Pixel CMOS Sensor With Multiple Storage Capacitors," filed Apr. 16, 1998 now U.S. Pat. No. 6,078,037.

BACKGROUND

The invention relates to an imager.

Figure 1:
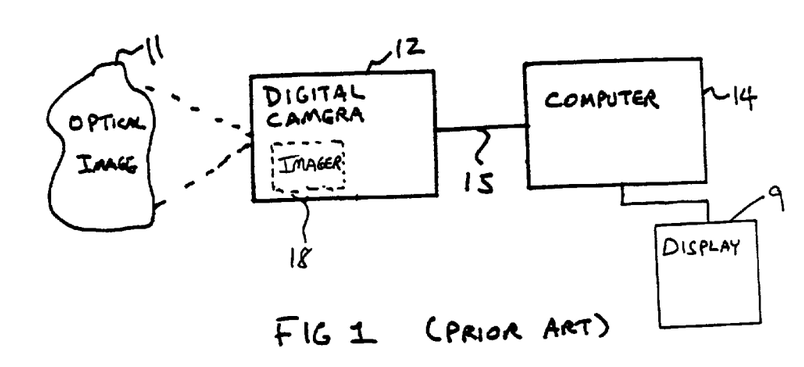
FIG. 1 is a block diagram of a digital imaging system of the prior art.

Referring to FIG. 1, a typical digital camera 12 uses an imager 18 to electrically capture an optical image 11. To accomplish this, the imager 18 typically includes an array 13 (see FIG. 2) of photon sensing, pixel sensors 20. During an integration interval, each pixel sensor 20 typically measures the intensity of a portion, or pixel, of a representation of the image 11 that is focused (by optics of the camera 12) onto the array 13. At the expiration of the integration interval, each sensor 20 typically indicates (via an analog signal, such as a voltage, for example) an intensity of light of the pixel.

The camera 12 typically processes the indications from the pixel sensors 20 to form a frame of digital data (which digitally represents the captured image) and transfers the frame (via a serial bus 15, for example) to a computer 14 for processing. For video, the camera 12 may capture several optical images and furnish several frames of data, each of which indicates one of the captured images. The computer 14 may then use the frames to recreate the captured video on a display 9.

Figure 2:
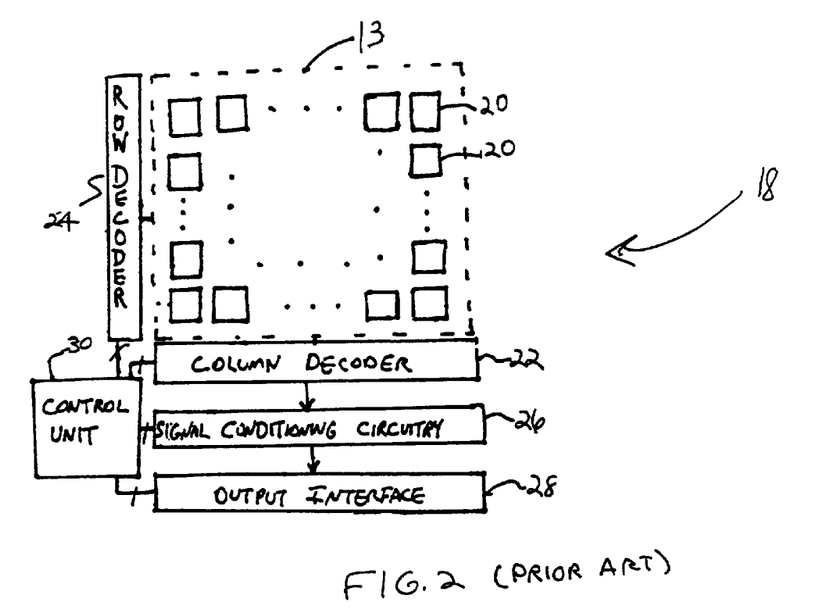
FIG. 2 is a schematic diagram of the imager of FIG. 1.

Referring to FIG. 2, the sensors 20 are typically arranged in rows and columns. In this manner, after the expiration of the integration interval, row 24 and column 22 decoders (of the imager 18) may begin selectively, electrically selecting the sensors 20 to retrieve the indications from the sensors 20.

The decoders 22 and 24 route the selected indications to signal conditioning circuitry 26 which might include, for example, analog-to-digital converters (ADCs) and circuitry to compensate for noise that is introduced by the sensors 20. The signal conditioning circuitry 26 may furnish data signals to an output interface 28 which includes circuitry for interfacing the imager 18 to other circuitry of the camera 12. A control unit 30 may coordinate the above-described activities of the imager 18.

Typically, a multi-color mosaic filter (not shown) covers the array 13 and configures each sensor 20 to sense the intensity of a primary color component of the associated pixel. For example, for the set of red, green and blue primary colors, the filter may cause each sensor 20 to sense either a red, green or blue primary color component of the pixel. Thus, with this arrangement, each sensor 20 only senses one primary color component of the pixel. However, for true color imaging, it may be desirable to obtain the other primary color components of the pixel.

Typically, the missing primary color components are obtained through interpolation. Using interpolation, the missing primary color components for a given pixel are derived by interpolating color components from the nearest pixels (adjacent, for example), or "nearest neighbors." For example, if a given sensor 20 senses a green component of a pixel, the red primary color component for that pixel may be interpolated from the information provided by neighboring sensors 20 that sense red primary color components. However, the interpolation only provides estimates (and not the actual values) of the missing color components.

Thus, there is a continuing need for an imager that provides actual primary color components of each pixel.

SUMMARY

In one embodiment, an imager includes an array of pixel sensors. Each pixel sensor indicates at least two different primary color components of an image. For each pixel sensor, at least two storage locations are located in the array, and these locations store the indications from the pixel sensor.

In another embodiment, a camera includes an array of pixel sensors, a programmable color filter, a controller and storage locations. Each pixel sensor indicates at least two primary color components of the image, and the programmable color filter substantially covers the array. The controller programs the color filter to cause the pixel sensors to sense the primary color components one at a time. For each pixel sensor, at least two of the storage locations are located in the array, and these locations store the indications from the pixel sensor.

DETAILED DESCRIPTION

Figure 3:
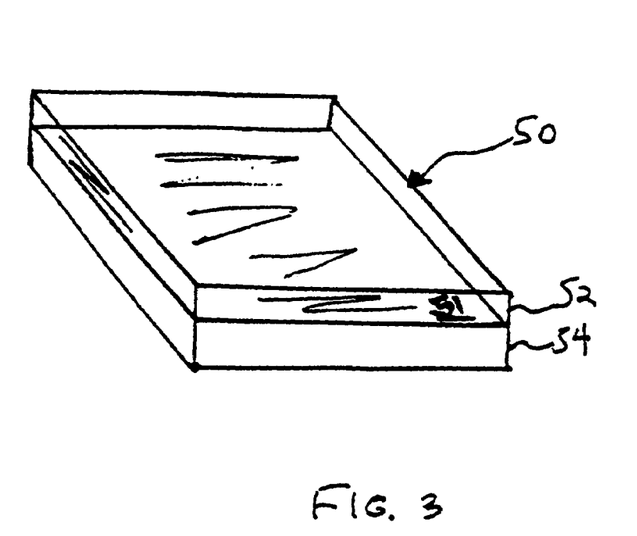
FIG. 3 is perspective view of an imager according to an embodiment of the invention.

Referring to FIG. 3, an embodiment 50 of a digital imager in accordance with the invention includes an imaging semiconductor chip 54 which has a light sensing, imaging surface 51. The surface 51 is located in a focal plane onto which images to be captured are focused and includes an array 60 (see FIG. 4) of pixel sensing units 68, each of which senses an intensity of light that strikes a portion, or pixel, of the surface 51. The surface 51 is covered by an electrically programmable color filter 52 (a color filter available from ColorLink, Inc., of Boulder, Colo., for example) which is electrically configured by the chip 54 to allow primary color components (primary color components from the set of red, green and blue primary colors, as examples) from the image to individually strike the surface 51 in succession and be detected by the pixel sensing units 68, as described below.

For this to occur, in some embodiments, the filter 52 (as described below) is configured by the chip 54 to successively cycle through three primary color modes. In each mode, the filter 52 allows a different one of the primary color components to pass through the filter 52 and strike the surface 51. As described below, each mode has a duration that is sufficient to permit each pixel sensing unit 68 to sense the corresponding color component of the associated pixel, and after sensing the color component, each pixel sensing unit 68 locally stores a color value that is indicative of the sensed primary color component. As described below, because the color values are stored locally in the array 60, the array 60, in some embodiments, is only scanned after all primary color components are captured.

Figure 4:
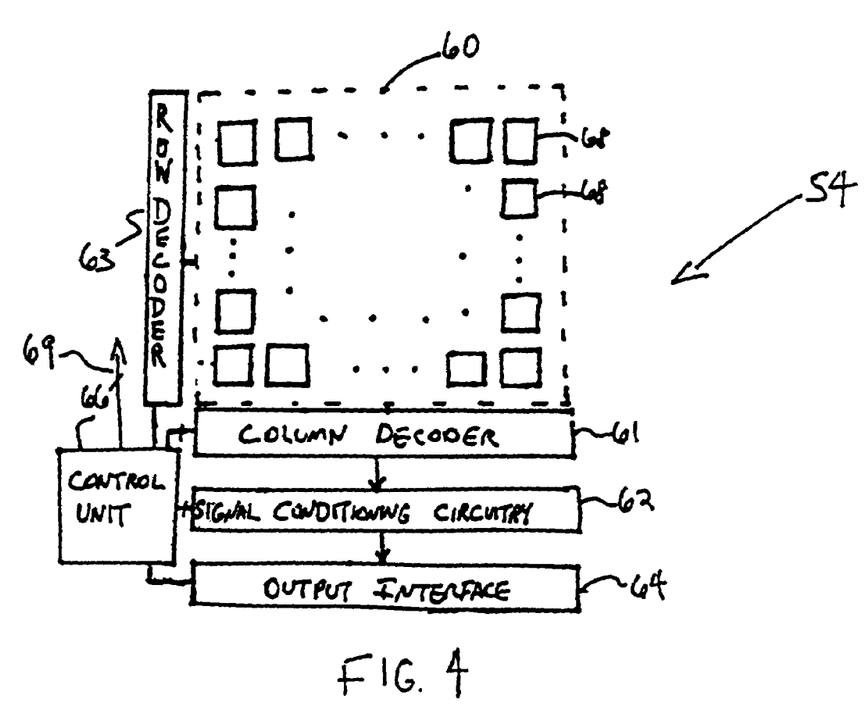
FIG. 4 is an electrical schematic diagram of the imager of FIG. 3.

After the color filter 52 cycles through all three modes, the array 60 is scanned to retrieve the stored color values (for all three color components). Referring to FIG. 4, each scanning of the array 60 may include successively scanning the rows of the array 60, one at a time. For example, row 63 and column 61 decoders may begin the scan by electrically selecting a group of the pixel sensing units 68 and one of the primary colors. Once selected, the pixel sensing unit 68 transfers the stored value (that corresponds to the selected color) to signal conditioning circuitry 62. The circuitry 62 may, for example, filter noise from the values before transferring the values to an output interface 64. The output interface 64 may include buffers for temporarily storing the color values and circuitry to interface the imager 50 to external circuitry (other components of a digital camera, for example). The chip 54 might also include, for example, a control unit 66 which has circuitry such as state machines and timers to control the scanning and data flow through the chip 54. The control unit 66 is coupled to selection lines 69 for selecting the stored color values in the array 60, and the control unit 66 also interacts with the color filter 52 to control the modes of the filter 52.

The advantages of storing the color values locally in the array 60 may include one or more of the following: The primary color components of a video image may be captured before the array is scanned; true color pixel values may be retrieved from the array; and the values may be formatted into digital words on the imager.

Figure 5:
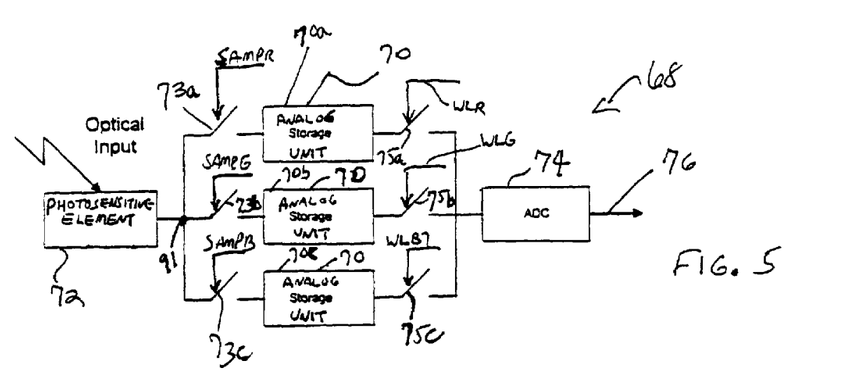
FIG. 5 is an electrical schematic diagram of a pixel sensing unit of the imager of FIG. 4.
Figures 6, 7, 8, 9, 10, 11, 12:
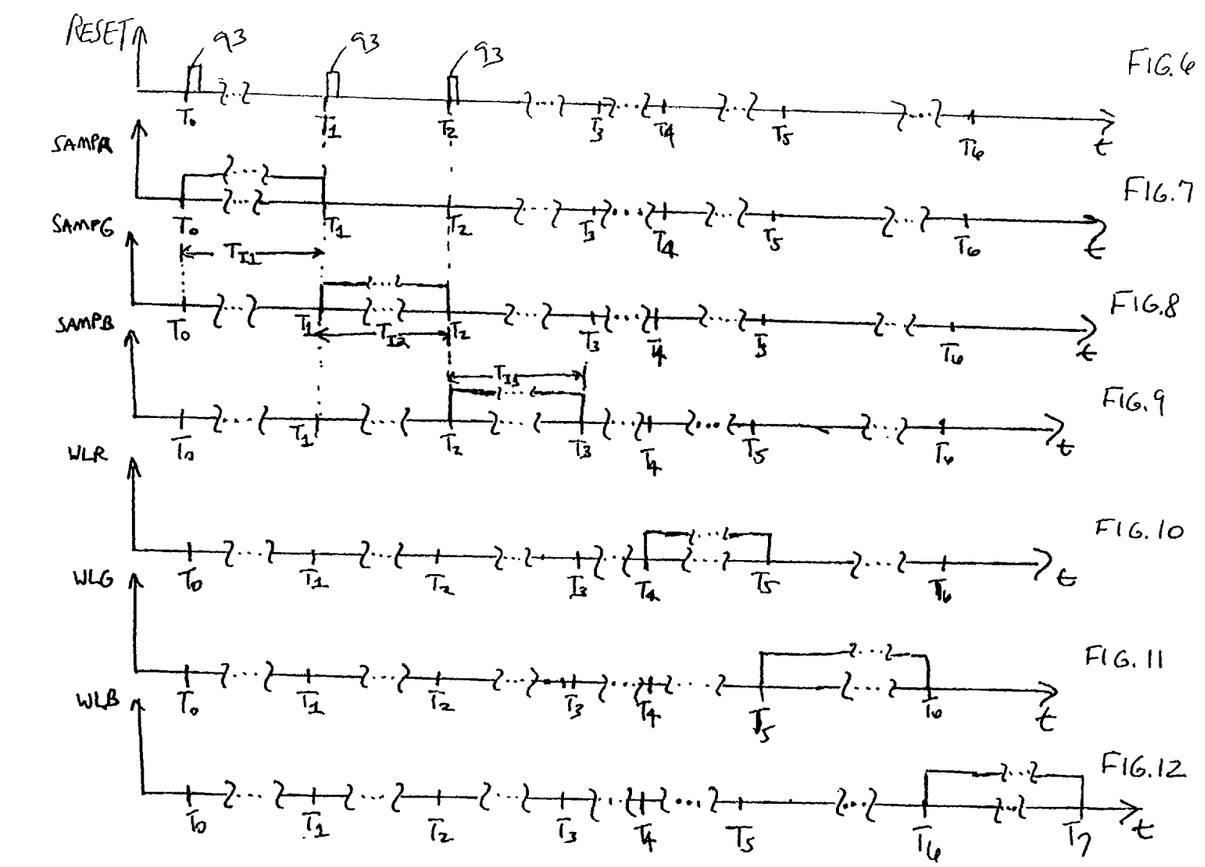
FIGS. 6, 7, 8, 9, 10, 11 and 12 are waveforms of signals of the imager.

Referring to FIG. 5, in some embodiments, the color values for each pixel sensing unit 68 may be represented by analog voltages that are stored in analog storage units 70 (units 70a, 70b and 70c, as examples). Each storage unit 70 stores a different color value. For example, if the pixel sensing unit 68 stores values for the primary colors of red, green and blue, the storage unit 70a may store the red color value, the storage unit 70b may store the green color value, and the storage unit 70c may store the blue color value. The storage units 70 may include, for example, capacitors.

Each pixel sensing unit 68 may include a photosensitive element 72, such as a photosensitive diode, that provides an output signal (a current, for example) that indicates the intensity of light that is sensed for the pixel. Because just one element 72 may be used to detect all three primary color components, the pixel sensing unit 68 may include multiplexing circuitry (described below) to route the signal from a sampling node 91 (an output terminal of the photosensitive element 72) to the appropriate storage unit 70 based on the mode of the color filter 52 (i.e., based on which primary color component is being sensed by the array 60).

The multiplexing circuitry includes switches to route the sensed color values to the appropriate storage unit 70. In this manner, in some embodiments (where the primary color components of red, green and blue are being captured, for example), when the color filter 52 is allowing the red color component to pass through, a switch 73a (which is controlled by a signal called SAMPR) closes to route the output signal from the sampling node 91 to the storage unit 70a. Similarly, when the color filter 52 is allowing the green color component to pass through, a switch 73b (controlled by a signal called SAMPG) closes to route the output signal from the node 91 to the storage unit 70b. Lastly, when the color filter 52 is allowing the blue color component to pass through, a switch 73c (controlled by a signal called SAMPB) closes to route the signal from the node 91 to the storage unit 70c. When one of the switches 70a, 70b or 70c is closed, the other two switches are open. Therefore, the output signal from the photosensitive element 72 is routed to only one of the storage units 70 based on the primary color component being sensed by the array 60.

The decoders 61 and 63 (see FIG. 4) select a particular color value that is stored by the pixel sensing unit 68. In this manner, the decoders 61 and 63 activate an appropriate select signal (described below) to select both the pixel sensing unit 68 and one of the primary colors. When this occurs, the multiplexing circuitry of the pixel sensing unit 68 transfers an indication of the selected color value from the corresponding storage unit 70 to an analog-to-digital converter (ADC) 74. The ADC 74 might be, for example, a serial ADC and may be shared by more than one pixel sensing unit 68. For example, in some embodiments, the ADC 74 may be a multi-channel bit serial (MCBS) ADC as described in David X. D. Yang, Boyd Fowler & Abbas el Gamal, *A Nyquist Rate Pixel Level ADC for CMOS Image Sensors*, The Custom Integrated Circuit Conference, May 1998, p. 237–40. In some embodiments, the ADC 74 converts the indication (an analog value, for example) from the storage unit 70 into digital bits that are serially communicated to the signal conditioning circuitry 62 (see FIG. 4) via a bit line 76.

The multiplexing circuitry of the pixel sensing unit 68 also routes the indications from the storage units 70 to the ADC 74. For example, the multiplexing circuitry may include switches 75 (switches 75a, 75b and 75c, as examples). When the decoders 61 and 63 assert (drive high, for example) a select signal (called WLR) to initiate retrieval of the red color value, the switch 75a closes to couple the storage unit 70a to the ADC 74. Similarly, when the decoders 61 and 63 assert a signal (called WLG) to initiate retrieval of the green color value, the switch 75b closes to couple the storage unit 70b to the ADC 74. Lastly, when the decoders 61 and 63 assert a select signal (called WLB) to initiate retrieval of the blue color value from the unit 70c, a switch 75c closes to couple the storage unit 70c to the ADC 74.

Referring to FIGS. 7, 8, 9, 10, 11 and 12, as an example, to capture a multi-color image, the control unit 66 might first assert (drive high, for example) the SAMPR signal (at time $T_0$) to close the switch 73a and deassert (drive low, for example) the SAMPG and SAMPB signals. The control unit 66 keeps the SAMPR signal asserted for an integration interval (called $T_{I1}$) from time $T_o$ to time $T_1$ during which the signal (a current signal, for example) from the node 91 is integrated by the storage unit 70a to form the stored red color value. Next, the control unit 66 deasserts the SAMPR signal at time $T_1$ and asserts the SAMPG signal during another integration interval (called $T_{I2}$) from time $T_1$ to time $T_2$ to store the green color value in the storage element 70b in a similar manner. The control unit 66 then deasserts the SAMPG signal and asserts the SAMPB signal during another integration interval (called $T_{I3}$) from time $T_2$ to time $T_3$ to store the blue color value in the storage unit 70c. After all three integration intervals expire, the decoders 61 and 63 may then assert, as examples, the WLR signal (from time $T_4$ to time $T_5$), the WLG signal (from time $T_5$ to time $T_6$) and the WLB signal (from time $T_6$ to time $T_7$) to selectively couple the associated storage units 70 to the bit line 76.

Figure 13:
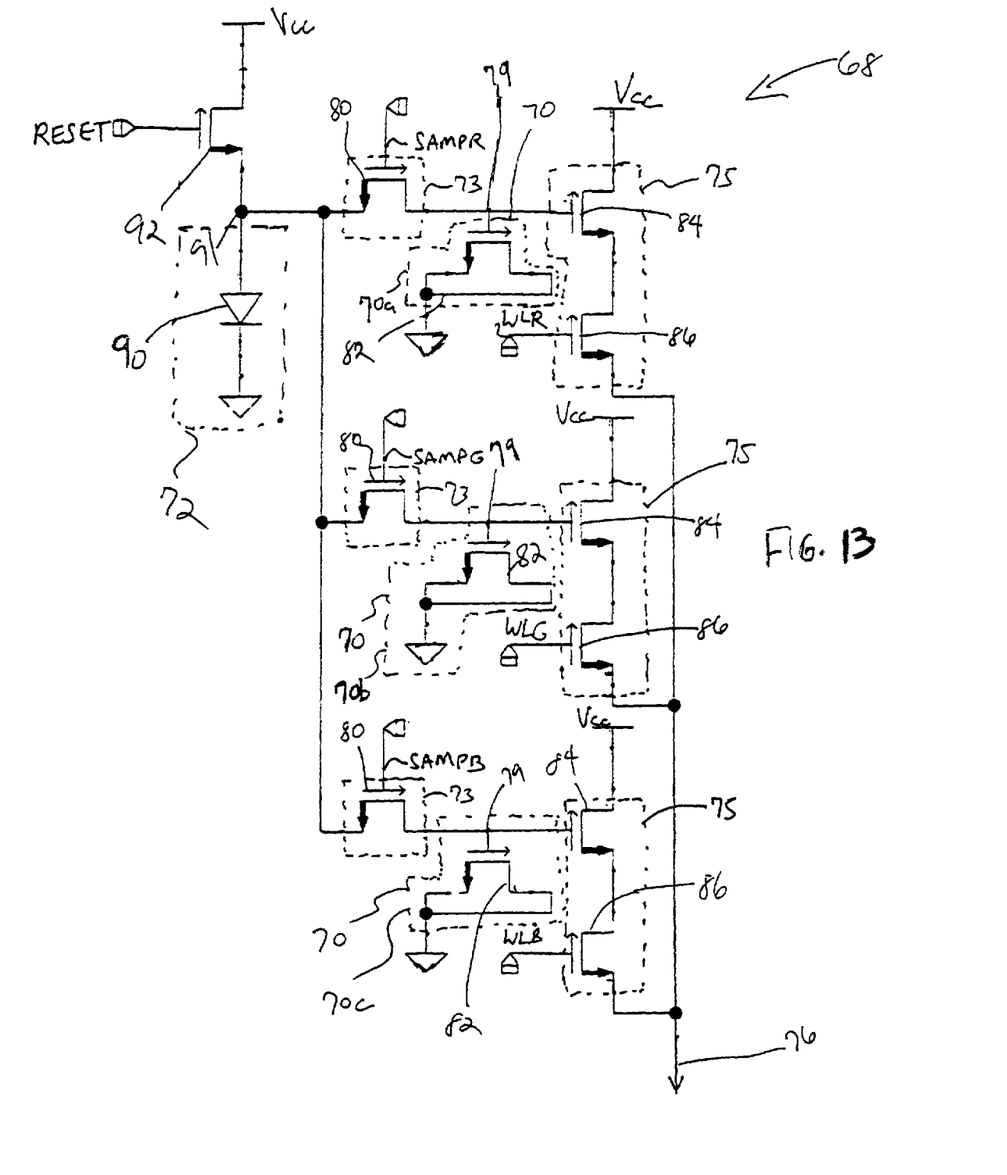
FIG. 13 is a more detailed electrical schematic diagram of the pixel sensing unit of FIG. 5.

Referring to FIG. 13, in some embodiments of the pixel sensing unit 68, the photosensitive element 72 includes a photosensitive diode 90 that is exposed at the surface 51 (see FIG. 3) to sense light. The cathode of the diode 90 is coupled to ground, and the anode of the diode 90 is coupled to the sampling node 91. An n-channel, metal-oxide-semiconductor field-effect-transistor 92 has its drain-source path coupled between the sampling node 91 and a positive voltage supply level (called $V_{CC}$). The gate of the transistor 92 is driven by a reset signal (called RESET) which is briefly asserted (driven high, for example) by the control unit 66 near the beginning of each integration interval $T_{I1}$, $T_{I2}$ and $T_{I3}$. In this manner, referring to FIG. 6, the control unit 66 pulses high the RESET signal at the beginning of each integration interval to cause the transistor 92 to conduct and pull the voltage level of the sampling node 91 near the Vcc positive voltage supply level. As a result, this brief pulse 93 causes a predetermined initialization value to be stored in the storage unit 70.

In some embodiments, the storage unit 70 might include a capacitor that is formed from an n-channel, metal-oxide-semiconductor field-effect-transistor 82. Each switch 73 (switches 73a, 73b and 73c, as examples) might include an n-channel, metal-oxide-semiconductor field-effect-transistor 80 that has its drain-source path coupled between the associated storage unit 70 and the sampling node 91. The drain of the transistor 80 forms a storage node 79 for, as an example, storing a voltage indicative of the light intensity of a specific color value. The gate of the transistor 80 is driven by the associated SAMPR, SAMPG or SAMPB signal.

Alternatively, the switch 73 may include an n-channel, metal-oxide-semiconductor field-effect-transistor that is configured as a source follower. In this manner, the source of the transistor is coupled to the storage node 79, the gate of the transistor is coupled to the sampling node 91, and the drain of the transistor receives a voltage (in place of the SAMPR signal) that turns the transistor either on or off.

Each switch 75 might include an n-channel, metal-oxide-semiconductor field-effect-transistor 84 that has its drain-source path coupled between the $V_{CC}$ positive voltage supply level and the bit line 76. The gate of the transistor 84 is coupled to the storage node 79. As a result of this arrangement, when the initialization value is stored in the associated storage unit 70, the storage node 79 has a positive voltage which places the transistor 84 in a linear conduction mode. As a result of this arrangement, during the integration interval, the voltage of the sampling node 79 is indicated by the source of the transistor 84.

The switch 75 may also include an n-channel, metal-oxide-semiconductor field-effect-transistor 86 which has its drain-source path coupled in series between the source of the transistor 84 and the bit line 76. The gate of the transistor 86 is driven by the associated WLR, WLG or WLB signal which causes the transistor 86 to either conduct or not conduct.

In other embodiments, the pixel sensing unit may include digital storage units. For example, referring to FIG. 14, a pixel sensing unit 100 includes digital storage units 102 that may, for example, replace the analog storage units 70 of the pixel sensing unit 68. In this manner, each digital storage unit 102 stores a digital value that represents a color value for the pixel. In the pixel sensing unit 100, the sampling node 91 is coupled to an input terminal of a sample and hold (SH) circuit 78. When the control unit 66 asserts (drives high, for example) a signal (called SAMPLE), the SH circuit 78 integrates and temporarily stores the signal provided by the sampling node 91. When the control unit 66 deasserts (drives low, for example) the SAMPLE signal, the SH circuit 78 transfers the resultant integrated signal to an ADC 103 (a serial ADC, for example). In some embodiments, the S/H circuit 78 may include a switch and a storage unit that are arranged in similar manner as the switch 73 and storage unit 70. The SAMPLE signal is used in place of the SAMPR, SAMPG and SAMPB signals and may be represented, in some embodiments, as a result of a logical ORing of these signals.

Figure 14:
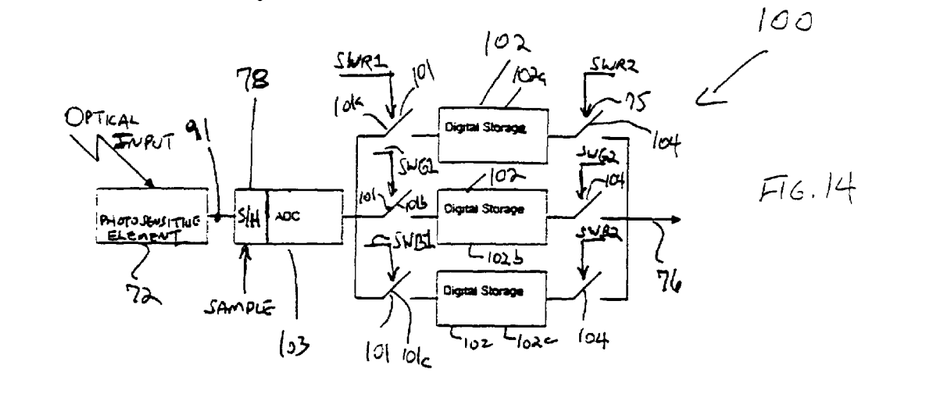
FIGS. 14 and 15 are electrical schematic diagrams of other pixel sensing units.

The digital output signal that is furnished by the ADC 103 is routed to one of the digital storage units 102. To accomplish this, each switch 101 (switches 101a, 101b and 10c, as examples) is coupled to the output terminal of the ADC 103 and to a different one of the digital storage units 102. As an example, for the case where the red, green and blue primary color components are being sensed by the array 60, at the end of the integration interval for the red primary color, the control unit 66 asserts a signal (called SWR1) to close the switch 101a to couple the ADC 103 to the digital storage unit 102a. After a predetermined interval of time elapses (eight clock cycles, for example), the control unit 66 deasserts the SWR1 signal to decouple the ADC 103 from the storage unit 102a. The other switches 101b and 101c are coupled in a similar manner and are exclusively activated by either the SWG1 or SWB1 signals in a similar manner after the expiration of the green and blue color integration intervals, respectively.

In some embodiments, for purposes of retrieving a color value from the pixel sensing unit 100 and furnishing that value to the bit line 76, the decoders 61 and 63 assert one of three select signals: an SWR2 signal (to select the storage unit 102a), an SWG2 signal (to select the storage unit 102b) and an SWB2 signal (to select storage unit 102c). The SWR2, SWG2 and SWB2 signals activate different switches 104, each of which is coupled between its associated digital storage unit 102 and the bit line 76.

In other embodiments, the pixel sensing unit may have fewer storage units than the number of primary colors being sensed. For example, referring to FIG. 15, in some embodiments, a pixel sensing unit 108 may be used in place of the units 68 or 100. The pixel sensing unit 108 is identical to the pixel sensing unit 100 except that the unit 108 does not include one of the digital storage units 102, such as the digital storage unit 102c, for example. Unlike the arrangement of the unit 100, one of the switches 101 (the switch 101c activated by the SWB1 signal, for example) is coupled between the output terminal of the ADC 103 and the bit line 76.

Figure 15:
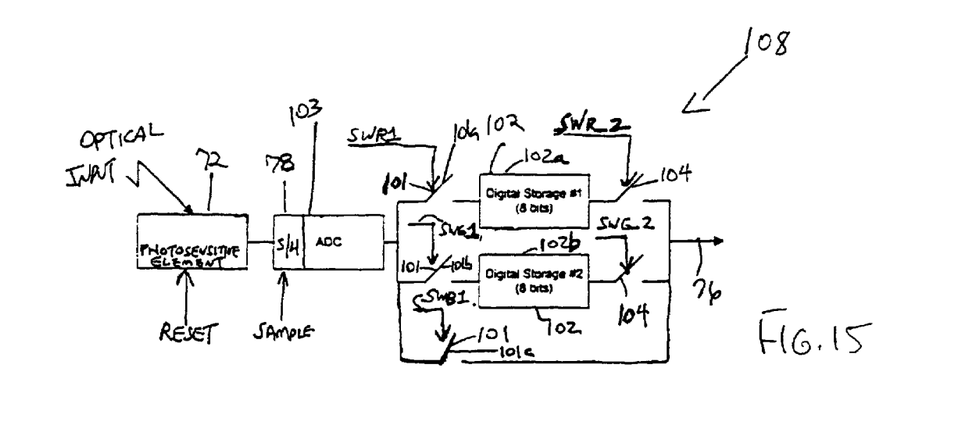

Due to this arrangement, an indication of the blue primary color component, for example, may be transferred directly from the ADC 103 to the bit line 76 without requiring temporary storage. As a result, the pixel sensing unit 108 may consume less semiconductor die area.

In some embodiments, a pixel sensing unit may be arranged similarly to the pixel sensing unit 108 except that this pixel sensing unit does not include the switch 10c. In this manner, the decoders 61 and 63 retrieve the stored color value from either the storage unit 102a or 102b before the ADC 103 processes the third color value (a blue color value, for example). In this manner, the control unit 66 may activate the appropriate switch 101a or 101b to store the third color value in the storage unit 102a or 102b from which the stored color value has already been retrieved.

Figure 16:
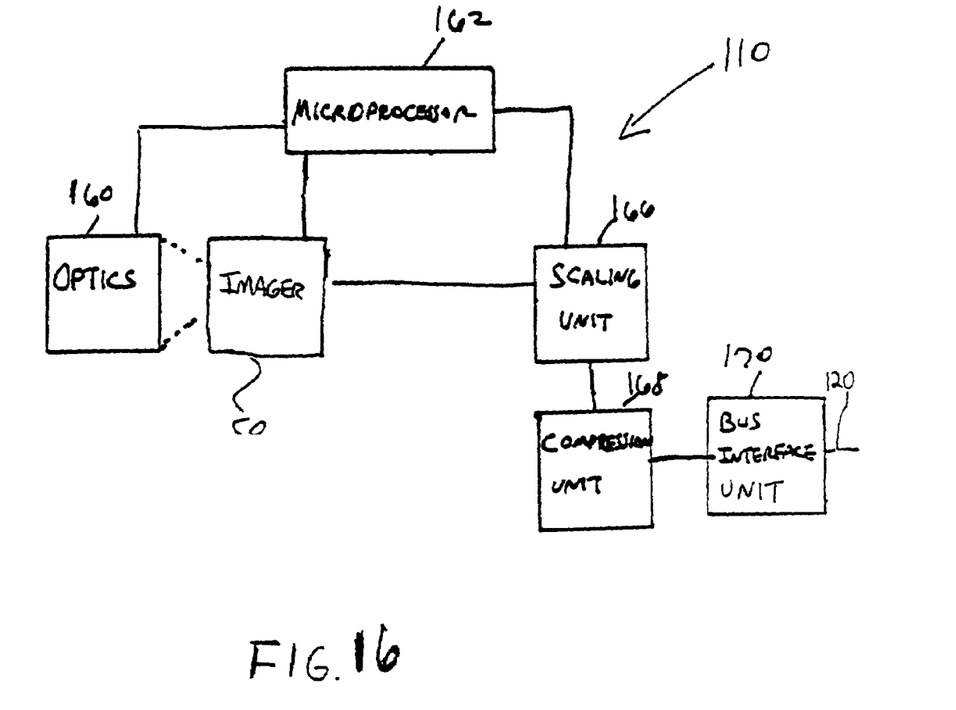
FIG. 16 is an electrical schematic diagram of a digital camera.

Referring to FIG. 16, in some embodiments, the imager 50 may be part of a digital camera 110. Besides the imager 50, the camera 110 may include optics 160 which form an image on the imaging surface 51 (see FIG. 4) of the imager 50. In some embodiments, the camera 110 includes a scaling unit 166 that may, for example, scale up or down the resolution of a transmitted image before communicating it to a bus 120 (a serial bus, for example) that is used for communication with, for example, a computer. The camera 110 may also include a compression unit 168 and a bus interface unit 170 to interact with the bus 120. To coordinate activities of these units, the camera 110 may include a microprocessor 162.

While the invention has been disclosed with respect to a limited number of embodiments, those skilled in the art will appreciate numerous modifications and variations therefrom. It is intended that the appended claims cover all such modifications and variations as fall within the true spirit and scope of the invention.

What is claimed is:

1. An imager comprising:
   an array of pixel sensors, each pixel sensor to provide an analog signal indicative of a pixel of an image having different primary color components;
   for each pixel sensor, at least two storage locations located in the array and each storage location being designated for a different one of the primary color components;
   for each pixel sensor, a sample and hold circuit and an analog-to-digital converter, the sample and hold circuit to integrate the analog signal to generate an analog integrated signal and the analog-to-digital converter to covert the analog integrated signal into a digital signal; and
   for each pixel sensor, switches to, during a first integration interval associated with one of the primary color components, store the digital signal in one of the storage locations and, during a second integration interval associated with another one of the primary color components, store the digital signal in another one of the storage locations.

2. The imager of claim 1, further comprising:
   switches to multiplex signals from the storage locations onto an output terminal of the imager.

3. The imager of claim 1, wherein said at least two storage locations comprise at least three storage locations for each pixel sensor.

4. A method comprising:
   providing a pixel sensor to provide an analog signal;
   providing at least two digital storage locations associated with the pixel sensor and each digital storage location being designated for a different primary color component of an image;
   integrating the analog signal in a sample and hold circuit to generate a first analog integrated signal, sampling the first analog integrated signal to generate a first sampled integrated signal, converting the first sampled integrated signal into a first digital signal, and storing the first digital signal in one of the associated storage locations; and
   integrating the analog signal in the sample and hold circuit to generate a second analog integrated signal, sampling the second analog integrated signal to generate a second sampled integrated signal, converting the second sampled integrated signal into a second digital signal, and storing the second digital signal in another one of the storage locations.

5. The method of claim 4, wherein
   the first digital signal indicates a first primary color component of the image; and
   the second digital signal indicates another primary color component different from the first primary color component of the image.

6. The method of claim 4, further comprising:
   forming a pixel sensor array that includes the pixel sensor.

7. A camera comprising:
   an array of pixel sensors, each pixel sensor to provide an analog signal indicative of a pixel of an image having different primary color components;
   for each pixel sensor, at least two storage locations located in the array and each storage location being designated for a different one of the primary color components;
   for each pixel sensor, a sample and hold circuit and an analog-to-digital converter, the sample and hold circuit to integrate the analog signal to generate an analog integrated signal and the analog-to-digital converter to covert the analog integrated signal into a digital signal; and
   for each pixel sensor, switches to, during a first integration interval associated with one of the primary color components, store the digital signal in one of the storage locations and, during a second integration interval associated with another one of the primary color components, store the digital signal in another one of the storage locations;
   a scaling unit to selectively scale data stored in said at least two storage locations.

8. The camera of claim 7, further comprising:
   switches to multiplex signals from the storage locations onto an output terminal of the camera.

9. The camera of claim 7, wherein said at least two storage locations comprise at least three storage locations for each pixel sensor.

10. The camera of claim 7, further comprising:
    a serial bus interface to communicate data stored in said at least two storage locations to a computer.

* * * * *